(12) United States Patent
Kalb

(10) Patent No.: US 7,253,678 B2
(45) Date of Patent: Aug. 7, 2007

(54) ACCURATE CASCODE BIAS NETWORKS

(75) Inventor: Arthur Joseph Kalb, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 46 days.

(21) Appl. No.: 11/098,904

(22) Filed: Apr. 4, 2005

(65) Prior Publication Data
US 2006/0197586 A1    Sep. 7, 2006

Related U.S. Application Data

(60) Provisional application No. 60/659,476, filed on Mar. 7, 2005.

(51) Int. Cl.
 G05F 1/10    (2006.01)
 G05F 3/02    (2006.01)
(52) U.S. Cl. .................................. 327/543
(58) Field of Classification Search ............ 327/538, 327/540, 541, 543
 See application file for complete search history.

(56) References Cited

U.S. PATENT DOCUMENTS

| | | | |
|---|---|---|---|
| 4,550,284 A | 10/1985 | Sooch | 323/315 |
| 4,583,037 A | 4/1986 | Sooch | 323/315 |
| 5,287,068 A * | 2/1994 | Olmstead et al. | 330/9 |
| 5,486,781 A * | 1/1996 | Im | 327/108 |
| 5,525,927 A | 6/1996 | Yung et al. | 327/543 |
| 5,834,967 A * | 11/1998 | Kuroda et al. | 327/543 |
| 5,867,067 A | 2/1999 | Moriarty | 330/288 |
| 5,959,446 A | 9/1999 | Kuckreja | 323/315 |
| 5,990,729 A * | 11/1999 | Kozuka et al. | 327/543 |
| 6,169,456 B1 | 1/2001 | Pauls | 330/288 |
| 6,466,083 B1 * | 10/2002 | Barnes | 327/543 |
| 6,680,605 B2 | 1/2004 | Chen et al. | 323/315 |
| 7,023,281 B1 | 4/2006 | Ali | 330/311 |

OTHER PUBLICATIONS

Gray, Paul R., et al., "Analysis and Design of Analog Integrated Circuits", fourth edition, 2001, John Wiley & Sons, New York, pp. 266-273.
Razavi, Behzad, "Design of Analog CMOS Integrated Circuits", 2001, McGraw-Hill, Boston, pp. 139-145.

* cited by examiner

*Primary Examiner*—Quan Tra
(74) *Attorney, Agent, or Firm*—Koppel, Patrick, Heybl & Dawson

(57) ABSTRACT

Bias networks are provided for accurate generation of biases of cascode transistor arrangements. Network embodiments generate a voltage that accurately biases the transistor of a cascode arrangement at a selected point in its saturation region and this voltage is accurately transferred to the drain of a transistor via the gate-to-source voltage drops of a pair of gate-coupled transistors.

31 Claims, 6 Drawing Sheets

US 7,253,678 B2

ACCURATE CASCODE BIAS NETWORKS

CROSS REFERENCES TO RELATED APPLICATIONS

This application claims the benefit of U.S. Provisional Application Ser. No. 60/659,476 filed Mar. 7, 2005.

BACKGROUND OF THE INVENTION

1. Field of the Invention

The present invention relates generally to cascode transistor arrangements.

2. Description of the Related Art

For metal-oxide-semiconductor transistors, a cascode arrangement often couples a common-gate cascode transistor to the drain of a second transistor. The cascode transistor provides a substantially enhanced output impedance. Other cascode transistors can be added to further enhance the output impedance. Although various networks have been proposed for biasing cascode arrangements, they have generally failed to accurately bias the second transistor at a desired point in its saturation region and maintain that point over variations in operating conditions (e.g., process, supply and temperature).

BRIEF SUMMARY OF THE INVENTION

The present invention is directed to bias networks for accurate biasing of cascode transistor arrangements. The novel features of the invention are set forth with particularity in the appended claims. The invention will be best understood from the following description when read in conjunction with the accompanying drawings.

DETAILED DESCRIPTION OF THE INVENTION

FIGS. 1-6 illustrate bias-network embodiments that are particularly suited for providing biases of cascode transistor arrangements. For example, the network embodiments generate a voltage which is accurately transferred to the drain of a transistor via the gate-to-source voltage drops of a pair of gate-coupled transistors.

Figure 1:
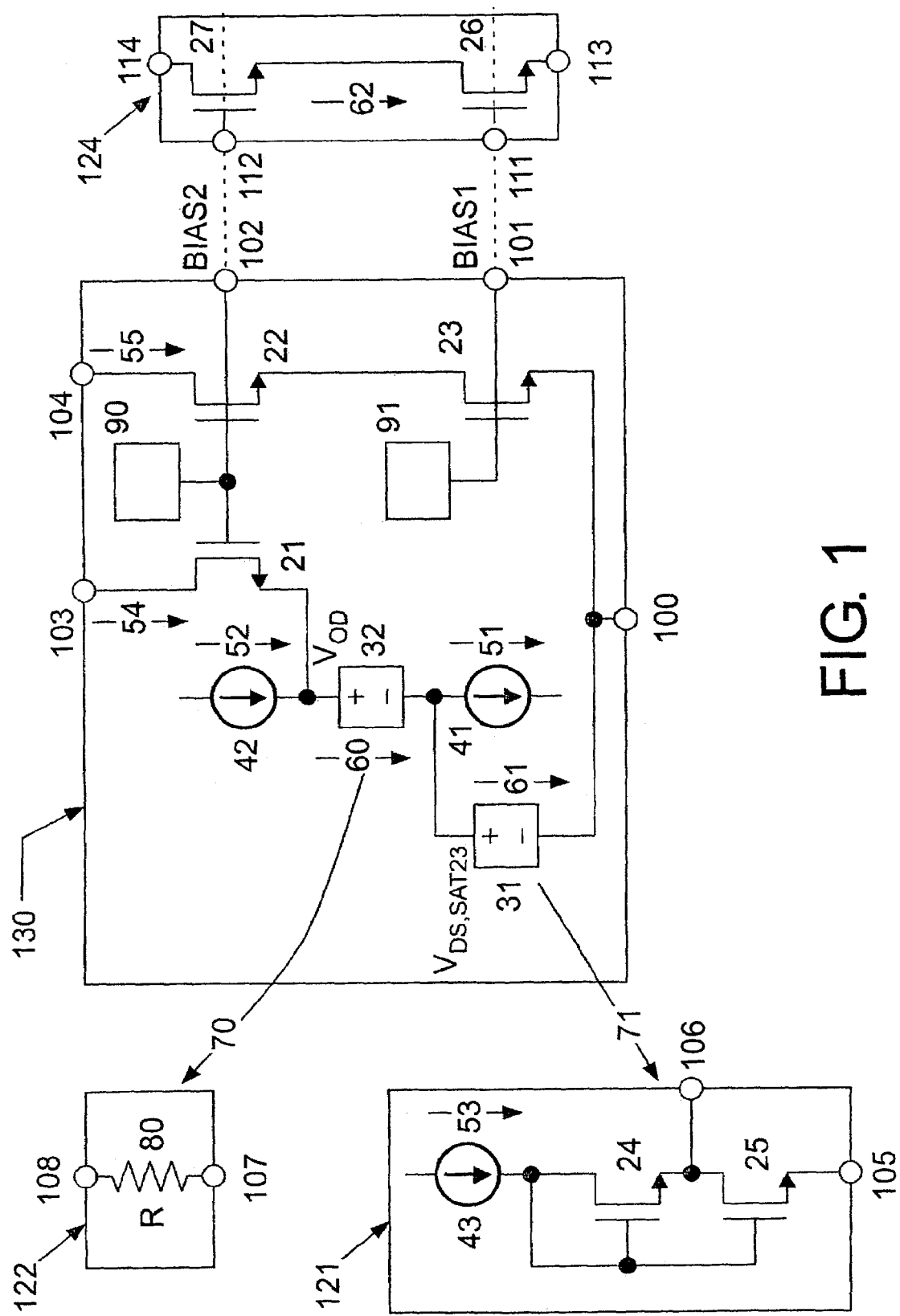
FIG. 1 is a diagram of a bias-network embodiment of the present invention.

In particular, FIG. 1 illustrates a bias network embodiment 130 which includes a first voltage-drop generator 31, a second voltage-drop generator 32, a first transistor 21, a second transistor 22, a third transistor 23, a first gate-bias regulator 90, and a second gate-bias regulator 91. The first voltage-drop generator is coupled to port 100. The second voltage-drop generator 32 is coupled between the first voltage-drop generator 31 and the source of the first transistor 21. The first transistor 21 has a gate coupled to the first gate-bias regulator 90. In one possible embodiment, the gate-bias regulator 90 sets the voltage at the gate of transistor 21 so that it conducts a current 54. In another possible embodiment, the gate-bias regulator maintains a desired gate-source voltage drop across transistor 21. The drain of transistor 21 is coupled to port 103. The second transistor 22 has a gate coupled to the gate of the first transistor 21. The third transistor 23 has a gate coupled to the second gate-bias regulator 91, a drain coupled the source of the second transistor 22 and a source coupled to port 100. In one embodiment, the gate-bias regulator 91 sets the voltage at the gate of transistor 23 so that it conducts a current 55. In another embodiment, the gate-bias regulator 91 sets the gate-source voltage drop across transistor 23. In the bias-network embodiment 130, a first current source 41 provides a first current 51 to the common node between the first voltage-drop generator 31 and the second voltage-drop generator 32. A second current source 42 provides a second current 52 to the source node of first transistor 21.

The first voltage-drop generator 31 is configured to generate a drain-source saturation voltage $V_{DS,\ SAT23}$ of the third transistor 23 and the second voltage-drop generator 32 is configured to generate an over-drive voltage $V_{OD}$. The drain-source saturation voltage, $V_{DS,\ SAT23}$, is the least voltage which insures that the third transistor 23 is biased in its saturation region. The over-drive voltage, $V_{OD}$, is selectable to enhance network performance by accurately spacing the third transistor's bias from the transition between its linear and saturation behaviors.

The first and second current sources 41 and 42 are configured to provide currents 51 and 52 respectively so as to control the currents 60 and 61 to the over-drive voltage-drop generator 32 and the drain-source saturation voltage-drop generator 31 respectively. The current 60 through the over-drive voltage-drop generator 32 equals the sum of the current 52 and the current out of the source of the first transistor 21. The current 61 through the drain-source saturation voltage-drop generator 31 equals the difference between the current 60 and the current 51.

Although various embodiments of the first voltage-drop generator 31 may be used to form network embodiments of the invention, an arrow 71 indicates an exemplary voltage-drop generator 121 which includes a fourth transistor 24 and a fifth transistor 25. The source of fifth transistor 25 is coupled to the port 105. Port 105 is typically coupled to the port 100. The gate and drain of the fourth transistor 24 is coupled to the gate of the fifth transistor 25. The source of fourth transistor 24 is coupled to the drain of the fifth transistor 25 and to port 106. Port 106 is connected to the common node between the first voltage-drop generator 31 and the second voltage-drop generator 32. Typically the fourth transistor 24 carries a first current density and the fifth transistor 25 carries a second current density greater than the first current density. In an embodiment, the fourth transistor 24 carries the current of a third current source 43. The fifth transistor carries a current which equals the sum of the current out of the source of the fourth transistor and any current flowing into the port 106. Typically, the current flowing into port 106 is the difference between current 60 and current 51.

The fourth transistor 24 has a first channel width-to-length ratio (W/L) and the fifth transistor 25 has a second channel width-to-length ratio less than the first channel width-to-length ratio. In one embodiment, the first channel width-to-length ratio is substantially three times the second channel width-to-length ratio and the third and fourth transistors 23 and 24 carry the same current because it has been shown that this relationship will accurately provide the drain-source saturation voltage for the third transistor 23.

Although various embodiments of the second voltage-drop generator 32 may be used to form network embodiments of the invention, an arrow 70 indicates an exemplary voltage-drop generator 122 which includes a resistor 80 that has a resistance R and carries a current 60 of value $I_{60}$. The ends of the resistor 80 form ports 107 and 108. The over-drive voltage $V_{OD}$ generated between these ports is $RI_{60}$. Ports 107 and 108 are coupled between the saturation voltage-drop generator 31 and the source of the first transistor 21.

The over-drive voltage $V_{OD}$ can be altered by altering R, by altering the current through the resistor, or by altering both. With proper structuring of the resistor 80 and/or the current 60, various responses over temperature (e.g., proportional to absolute temperature (PTAT) or complementary to absolute temperature (CTAT)) can be realized to enhance circuit performance.

One possible embodiment of bias-network 130 arranges currents 54 and 55 so that they are substantially equal and sizes the first and second transistors 21 and 22 to be substantially equal so that the gate-to-source voltages of these transistors are substantially equal and thus the voltage at the source of the first transistor 21 is accurately replicated at the drain of the third transistor 23. Thus, the drain-to-source voltage across transistor 23 is substantially equal to its drain-source saturation voltage plus the over-drive voltage.

The network of FIG. 1 forms a low-voltage headroom circuit. The voltage difference between port 103 and port 100 preferably obtains to a voltage equal to or in excess of the sum of the gate-to-source voltage of the first transistor 21, the over-drive voltage $V_{OD}$, and the drop across the drain-source saturation voltage-drop generator 31. Additionally, the voltage difference between port 104 and port 100 preferably obtains to a voltage equal to or in excess of the drain-source saturation voltage of transistor 23 plus the over-drive voltage $V_{OD}$ plus the drain-source saturation voltage of transistor 22. Additional headroom constraints on the operation of bias-network 130 may result from the necessity to provide the gate voltages of transistors 21 and 23. The voltage drop between the gate of transistor 21 and port 100 preferably obtains to a voltage equal to or in excess of the drain-source saturation voltage of transistor 23 plus the over-drive voltage $V_{OD}$ plus the gate-source voltage of transistor 21. The voltage drop between the gate of transistor 23 and port 100 preferably obtains to a voltage equal to or in excess of the gate-source voltage of transistor 21.

The bias network 130 provides, at output ports 101 and 102, first and second bias voltages $V_{BIAS1}$ and $V_{BIAS2}$. Presuming ports 100 and 113 are maintained at substantially the same voltage, $V_{BIAS1}$ and $V_{BIAS2}$ can be effectively used to bias one or a plurality of cascoded transistor networks 124 that each comprises a cascoded transistor 26 and a cascode transistor 27. In an embodiment, the substantial equality between the voltages at ports 100 and 113 is obtained by coupling ports 100 and 113 together. The gate of transistor 26 is coupled to the first bias voltage $V_{BIAS1}$ and the gate of the cascode transistor 27 is coupled to the second bias voltage $V_{BIAS2}$. The source of the cascode transistor 27 is coupled to the drain of transistor 26. Because the gate of transistor 26 carries the same first bias voltage $V_{BIAS1}$ as the third transistor 23, it will provide a current 62 whose amplitude is related to that of the fifth current 55 by the ratio of the channel width-to-length ratio (W/L) of transistor 26 to that of the third transistor 23. The current 62 will substantially flow in port 114 and through transistor 27. If cascode transistor 27 is sized to have substantially the same current density as the second transistor 22, it will have substantially the same gate-to-source voltage and, accordingly, the drain of transistor 26 will also be accurately biased at its drain-source saturation voltage plus the over-drive voltage $V_{OD}$.

The bias voltages $V_{BIAS1}$ and $V_{BIAS2}$ allow for a low-voltage headroom circuit. When ports 100 and 113 are coupled this circuit forms a current source. The voltage difference between ports 113 and 114 preferably obtains to a value equal to or in excess of the drain-source saturation voltage of transistor 27 plus the over-drive voltage $V_{OD}$ plus the drain-source saturation voltage of transistor 26. Preferably the voltage at port 111 obtains to a gate-to-source voltage drop above the voltage at port 113. Port 112 preferably obtains to a voltage equal to the voltage at port 113 plus the drain-source saturation voltage of transistor 26 plus the over-drive voltage $V_{OD}$ plus the gate-source voltage of transistor 27.

The biasing of the third transistor 23 with a drain-to-source voltage in excess of its drain-source saturation voltage by an over-drive voltage in the network embodiment 130 of FIG. 1 is substantially independent of transistor parameters (e.g., threshold voltage and back-bias). Similarly, the biasing of the cascoded transistor 26 with a drain-to-source voltage in excess of its drain-source saturation voltage by an over-drive voltage is substantially independent of transistor parameters. In one network embodiment, the network is structured so that each group of transistors 21, 22 and 27 and transistors 23 and 26 are configured to carry substantially the same current density. Preferably, channel lengths are substantially equal except for the fifth transistor 25. Various other network embodiments may alter these relationships but alter them so as to maintain accurate generation of the drain-source saturation voltage plus over-drive voltage and accurate transfer of this bias to the cascoded transistor of cascode arrangements.

Figure 2:
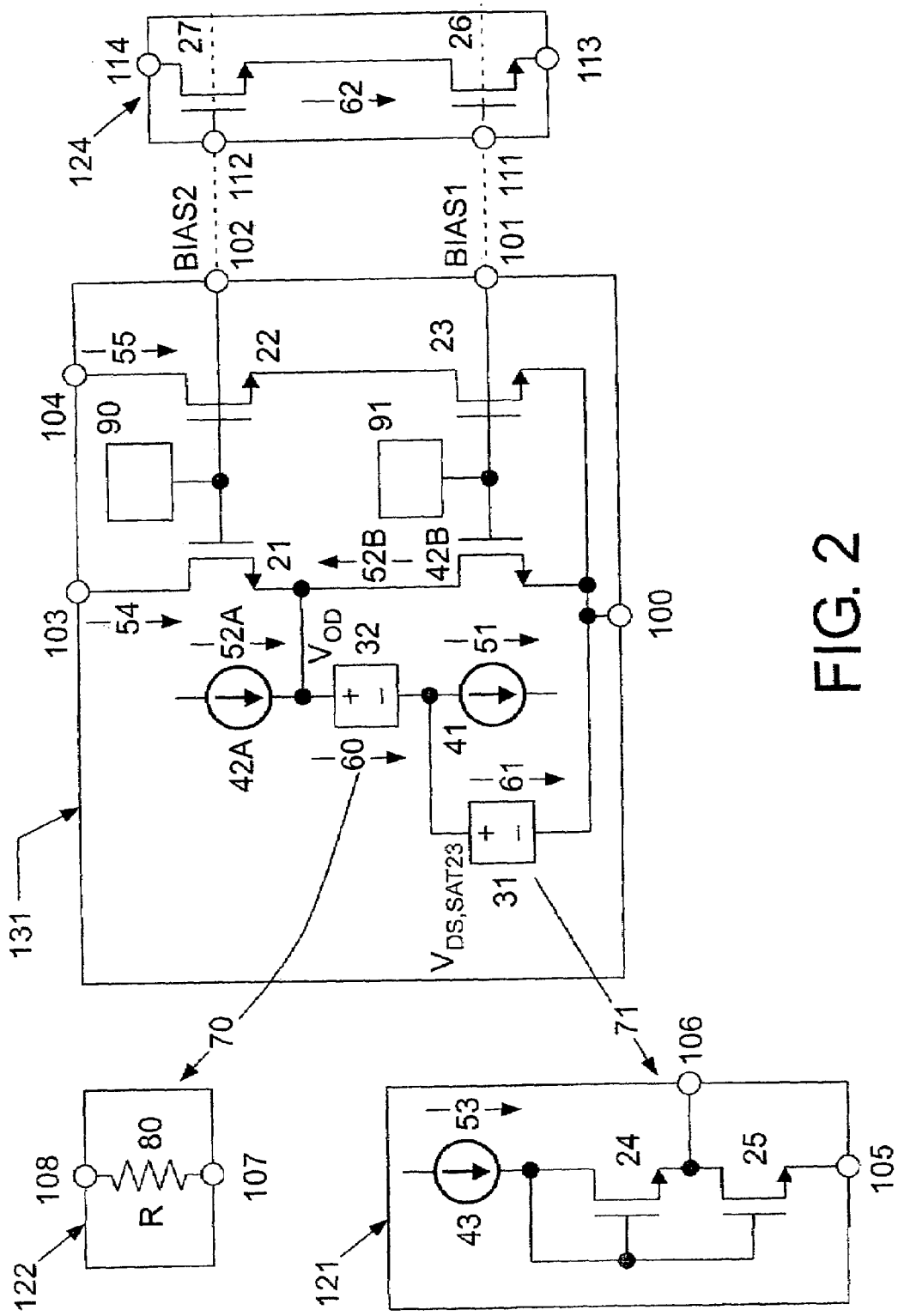
FIGS. 2, 3, 4 and 5 are diagrams of other bias-network embodiments.
Figure 3:
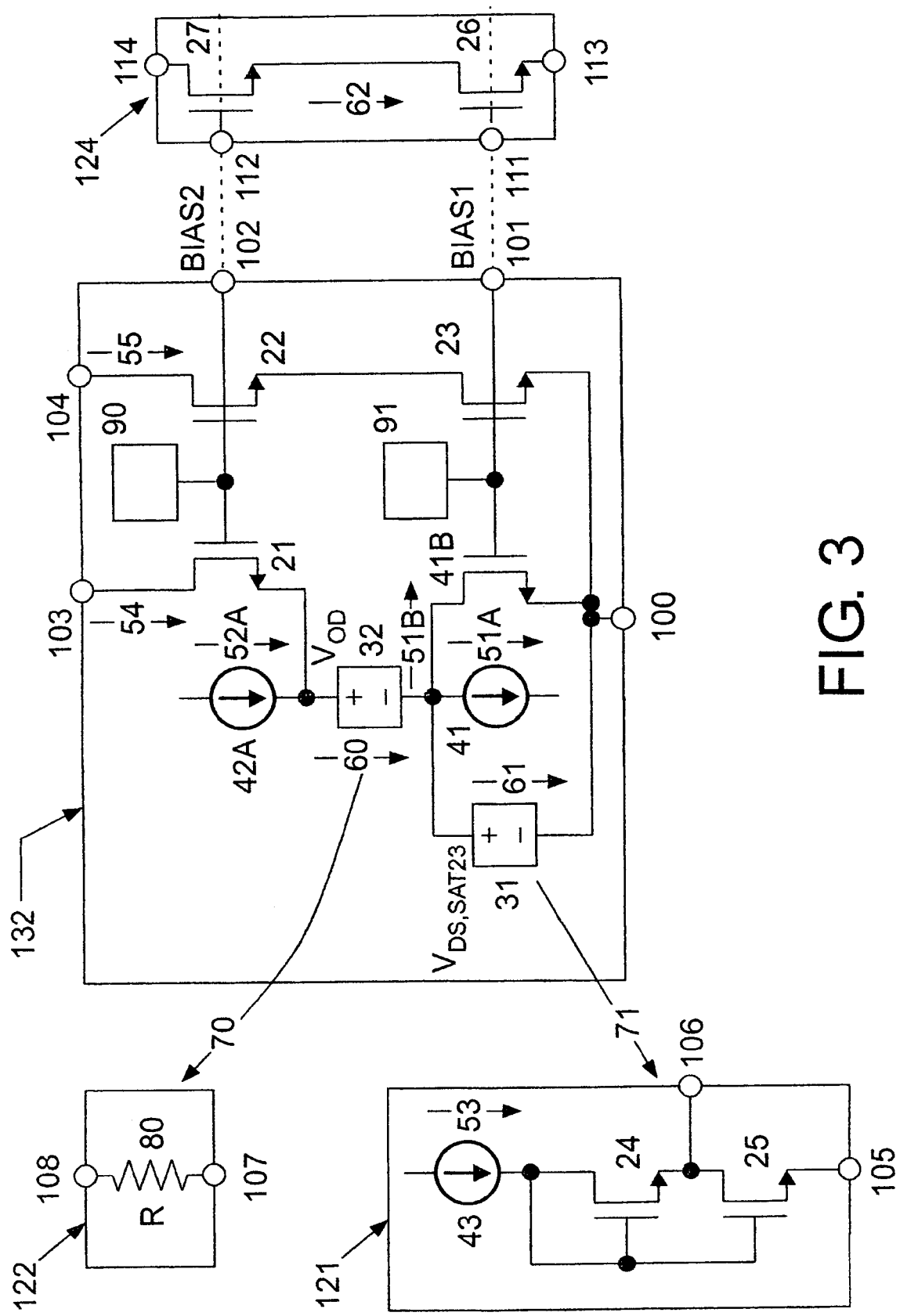

FIGS. 2 and 3 illustrate other bias-network embodiments 131 and 132 which include elements of the embodiment 130 of FIG. 1 with like elements indicated by like reference numbers. In the bias network 131 of FIG. 2, the current source 42 of FIG. 1 is replaced with a current source 42A and a transistor 42B. Current source 42A couples into the source of transistor 21. Transistor 42B has a gate and a source coupled to the gate and source of transistor 23 respectively. The drain of transistor 42B is coupled to the source of transistor 21. In one embodiment according to FIG. 2, transistor 42B is biased so as to conduct substantially all of the current flowing out of the source of transistor 21 so that the current 60 through the second voltage-drop generator 32 substantially equals the current 52A through the current source 42A. Other embodiments may bias transistor 42B so as to conduct a current (away from a circuit node indicated by arrow 52B) that is greater or less than the current flowing out of the source of transistor 21. The bias network 132 of FIG. 3 is similar to the network 131 of FIG. 2 but transistor 42B is replaced with a transistor 41B. Current source 41 and the drain of transistor 41B both couple into the common node between the drain-source saturation voltage-drop generator 31 and the over-drive voltage-drop generator 32. Transistor 41B has a gate and a source coupled to the gate and source of transistor 23 respectively. In one embodiment according to FIG. 3, transistor 41B is biased so as to conduct a current 51B which is substantially all of the current flowing out of the source of transistor 21 so that current source 41 generates a current 51A that substantially equals the current 52A. Other embodiments may bias transistor 41B so as to conduct a current that is greater or less than the current flowing out of the source of transistor 21.

Figure 4:
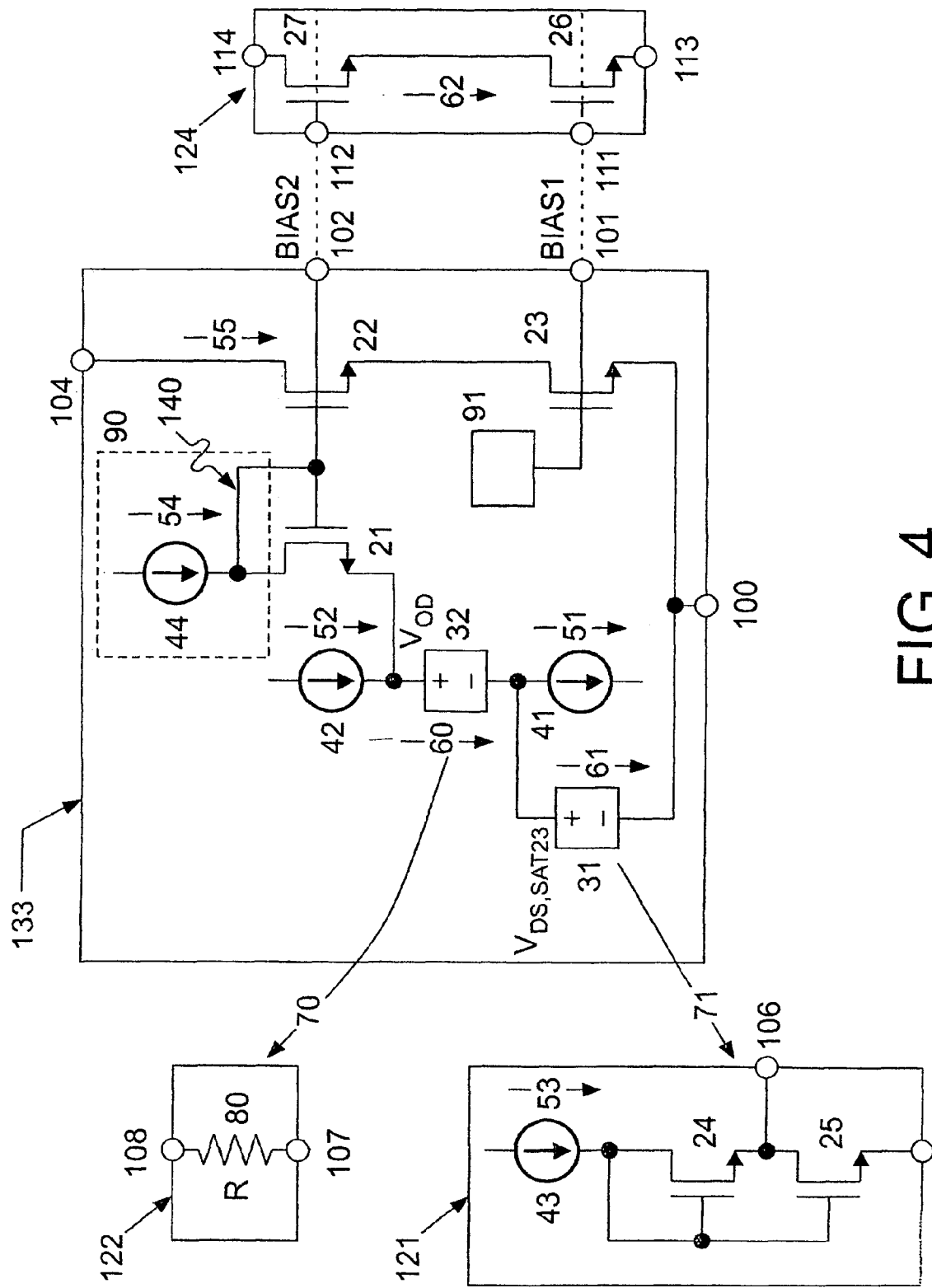
Figure 5:
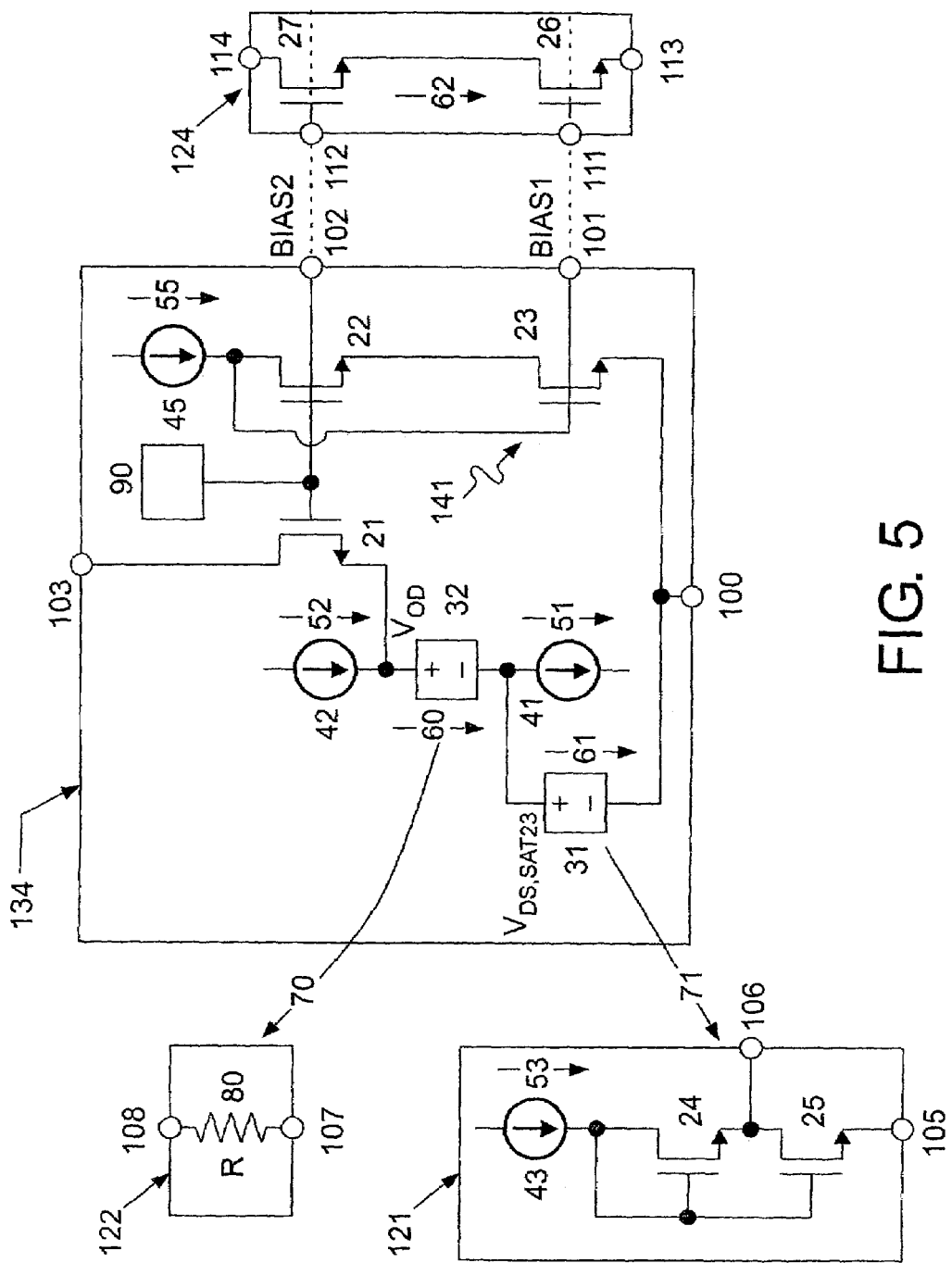

FIGS. 4 and 5 illustrate other bias-network embodiments 133 and 134 which include elements of the embodiment 130 of FIG. 1 with like elements indicated by like reference numbers. In the bias network 133 of FIG. 4, an embodiment of the first gate-bias regulator 90 is shown to be a current source 44 and a conductive path 140 which couples the gate and drain of transistor 21. Current source 44 provides a current 54. Gate-bias regulator 90 sets the gate voltage of transistor 21 so that the transistor conducts the current 54. In the bias network 134 of FIG. 5, an embodiment of the second gate-bias regulator 91 is shown to be a current source 45 and a conductive path 141 which couples the gate and drain of transistor 23. Current source 45 provides a current 55. This structure sets the gate voltage of transistor 23 so that the transistor conducts the current 55.

Figure 6:
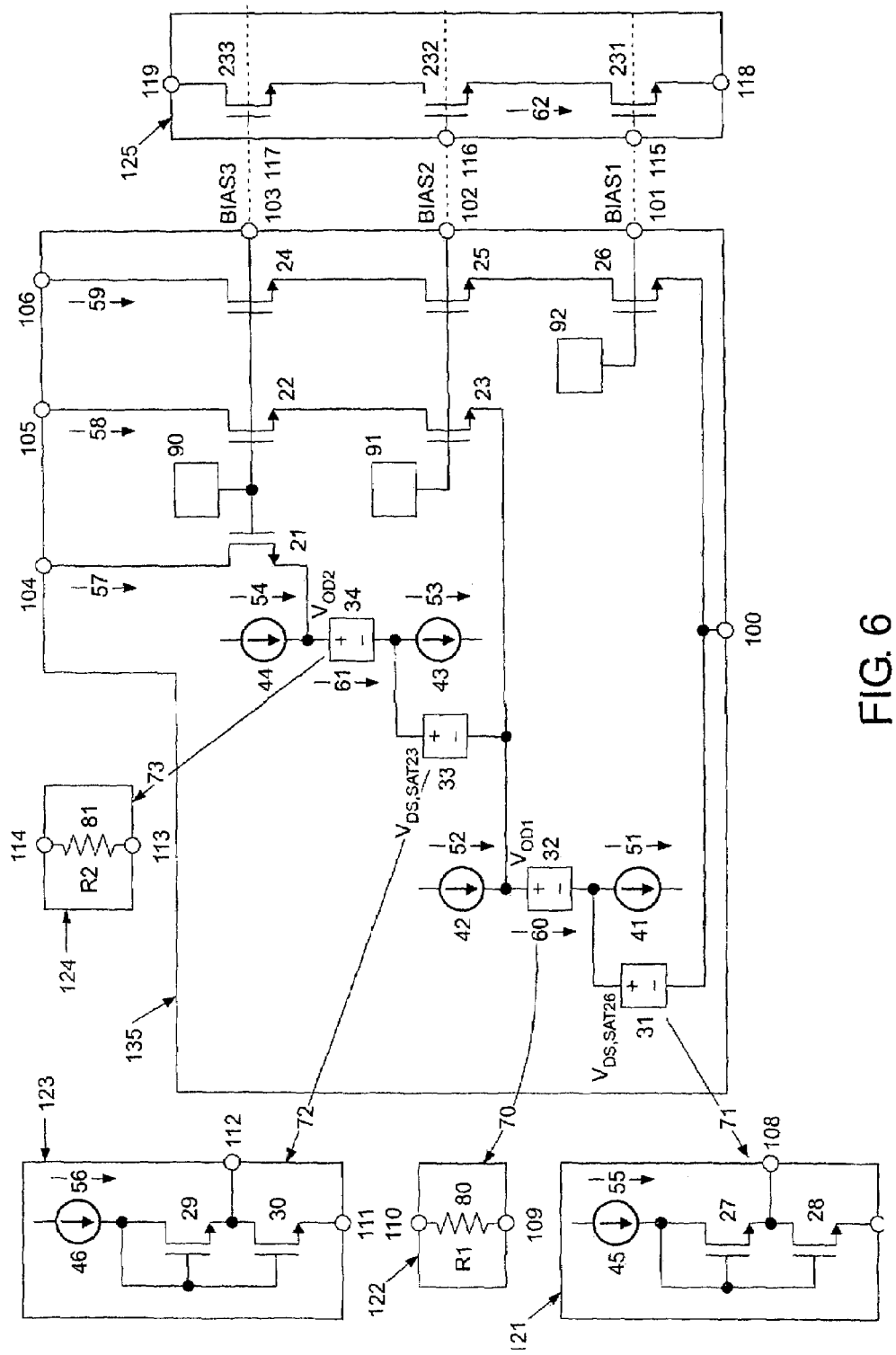
FIG. 6 is a diagram of yet another bias-network embodiment.

A bias-network embodiment 135 is shown in FIG. 6 which is basically a nested application of the bias network 130 of FIG. 1. The network 135 illustrates that the teachings of embodiments of the invention can be applied to the biasing of other cascoded transistor networks. The network 135 includes elements of the bias network 130 with like elements indicated by like reference numbers. Similar to the gate bias regulators 90 and 91, a gate bias regulator 92 is provided for transistor 92.

The bias-network embodiment 135 in FIG. 6 produces a voltage drop between port 100 and the source of transistor 23 substantially equal to the drain-source saturation voltage of transistor 26, $V_{DS, SAT26}$, plus an over-drive voltage $V_{OD1}$. The voltage at the source of transistor 23 is then replicated at the source of transistor 25 via the gate-source voltage drops of transistors 23 and 25. Preferably, transistors 23 and 25 are biased with the same current density thereby establishing a drain-to-source voltage across transistor 26 equal to its drain-source saturation voltage plus the over-drive voltage VOD1. Similarly, the bias-network 135 produces a voltage drop between the source of transistor 23 and the source of transistor 21 substantially equal to the drain-source saturation voltage of transistor 23, $V_{DS, SAT23}$, plus the over-drive voltage $V_{OD2}$. The voltage at the source of transistor 21 is then replicated at the source of transistor 22 via the gate-source voltage drops of transistors 21 and 22. Preferably transistors 21 and 22 are biased with the same current density thereby establishing a drain-source saturation voltage across transistor 23 equal to its drain-source saturation voltage plus the over-drive voltage $V_{OD2}$. Furthermore, the voltage at the source of transistor 21 is replicated at the source of transistor 24 via the gate-source voltage drops of transistors 21 and 24. Preferably, transistors 21 and 24 are biased with the same current density thereby establishing a drain-source saturation voltage across transistor 25 equal to the drain-source saturation voltage of transistor 23 plus the over-drive voltage $V_{OD2}$, provided the sources of transistors 23 and 25 are at substantially the same voltage. The sources of transistors 23 and 25 will be at substantially the same voltage if transistors 23 and 25 are biased with substantially the same current density.

As indicated by arrows 71 and 72, network embodiments of drain-source saturation voltage drop generators 31 and 33 have exemplary detailed network embodiments 121 and 123 respectively. In embodiment 121, transistor 28 is biased with three times the current density of transistor 26. In embodiment 123, transistor 30 is biased with three times the current density of transistor 23 and has a port 111 that couples to the source of transistor 23. In embodiment 121, transistor 27 is biased with a current density substantially equal to the current density of transistor 26 and receives a current 55 from a current source 45. In embodiment 123, transistor 29 is biased with a current density substantially equal to the current density of transistor 23 and receives a current 56 from a current source 46. This bias arrangement causes a voltage drop between ports 100 and 108 substantially equal to the drain-source saturation voltage of transistor 26 and a voltage drop between ports 111 and 112 substantially equal to the drain-source saturation voltage of transistor 23. As also shown in FIG. 1, the drain-source saturation voltage-drop generator 31 is associated with an over-drive voltage-drop generator 32 that carries a current 60 and current sources 41 and 42 that respectively carry currents 51 and 52. Similarly, the drain-source saturation voltage-drop generator 33 is associated with an over-drive voltage-drop generator 34 that carries a current 61 and current sources 43 and 44 that respectively carry currents 53 and 54. As also shown in FIG. 1, an arrow 70 indicates that the over-drive voltage-drop generator 32 may be an embodiment 122 which comprises an R1 resistor 80 between ports 109 and 110. Similarly, an arrow 73 indicates that the over-drive voltage-drop generator 34 may be an embodiment 124 which comprises an R2 resistor 81 between ports 113 and 114.

The bias network 135 provides, at output ports 101, 102 and 103, first, second and third bias voltages $V_{BIAS1}$, $V_{BIAS2}$ and $V_{BIAS3}$ that can be effectively used to bias one or a plurality of cascoded transistor networks 125, presuming ports 100 and 118 are maintained at substantially the same voltage. In an embodiment, the substantial equality between the voltages at ports 100 and 118 is obtained by coupling ports 100 and 118. Each cascoded transistor network 125 comprises a cascoded transistor 231, a first cascode transistor 232, and a second cascode transistor 233. The gate of transistor 231 is coupled to the first bias voltage $V_{BIAS1}$, the gate of the first cascode transistor 232 is coupled to the second bias voltage $V_{BIAS2}$ and the gate of the second cascode transistor 233 is coupled to the third bias voltage $V_{BIAS3}$. The source of the first cascode transistor 232 is coupled to the drain of the cascoded transistor 231. Provided that the source potentials of transistor 26 and transistor 231 are substantially equal, because the gate of the first cascoded transistor 231 (at port 115) carries the same first bias voltage $V_{BIAS1}$ as transistor 26 (from gate-bias regulator 92), it will provide a current 62 whose amplitude is related to that of the current 59 from port 106 by the ratio of the channel width-to-length ratio (W/L) of transistor 231 to that of the transistor 26. The current 62 will substantially flow in port 119, through transistor 233 and through transistor 232. If cascode transistor 232 (which has a gate at port 116) is sized to have substantially the same current density as the transistor 23 (which carries a current 58 from a port 105), it will have substantially the same gate-to-source voltage and, accordingly, the drain of the cascoded transistor 231 will also be accurately biased so that the applied drain-source voltage is substantially the saturation voltage plus the over-drive voltage $V_{OD1}$. Additionally, if second cascode transistor 233 (which has a gate at port 117) is sized to have substantially the same current density as transistor 21 (which carries a current 57 from a port 104), it will have substantially the same gate-to-source voltage and accordingly, the drain of the first cascode transistor 232 will also be accurately biased and the applied drain-source voltage is substantially the saturation voltage plus the over-drive voltage $V_{OD2}$.

In one embodiment, the network of FIG. 6 is structured so that each group of transistors 21, 22, 24 and 233, transistors 23, 25, and 232 and transistors 26 and 231 are configured to carry substantially the same current density.

Although the above description and the following claims often use numerical adjectives (e.g., first, second and so on) for identification, adjectives of the claims may differ from those of the description.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A bias network, comprising:
a first transistor;
a second transistor with its gate coupled to its drain and the gate of said first transistor, and its source coupled to the drain of said first transistor;
a voltage-drop generator with first and second ports with said first port coupled to the drain of said first transistor;
a third transistor with its source coupled to the second port of said voltage-drop generator; and a first gate-bias regulator coupled to the gate of
said third transistor; and further including:
a fourth transistor whose source is coupled to the source of said first transistor;
a fifth transistor with its gate coupled to the gate of said third transistor and its source coupled to the drain of said fourth transistor; and
a second gate-bias regulator coupled to the gate of said fourth transistor;
wherein said second gate-bias regulator comprises:
a current source arranged to pass a current through said fifth transistor; and
a conducting path coupling the drain of said fifth transistor to the gate of said fourth transistor.

2. A bias network, comprising:
a first transistor having a first drain and configured such that a drain-source saturation voltage is the least voltage that insures said first transistor is biased in its saturation region;
a second transistor having a source coupled to said first drain;
a third transistor having a gate coupled to the gate of said second transistor;
a first generator configured to provide said drain-source saturation voltage; and
a second generator coupled between said first generator and the source of said third transistor and configured to provide an over-drive voltage;
wherein said second generator includes:
first and second current sources; and
a resistor having a first end coupled to said first current source and said first generator and having a second end coupled to said second current source and the source of said third transistor;
and further including a fourth transistor having a gate coupled to the gate of said first transistor and having a drain coupled to said first end;
the sum of said drain-source saturation voltage and said overdrive voltage thereby biasing said first transistor.

3. A bias network, comprising:
a first transistor having a first drain and configured such that a drain-source saturation voltage is the least voltage that insures said first transistor is biased in its saturation region;
a second transistor having a source coupled to said first drain;
a third transistor having a gate coupled to the gate of said second transistor;
a first generator configured to provide said drain-source saturation voltage;
a second generator coupled between said first generator and the source of said third transistor and configured to provide an over-drive voltage;
wherein said second generator includes:
first and second current sources; and
a resistor having a first end coupled to said first current source and said first generator and having a second end coupled to said second current source and the source of said third transistor;
and further including a fourth transistor having a gate coupled to the gate of said first transistor and having a drain coupled to said second end;
the sum of said drain-source saturation voltage and said overdrive voltage thereby biasing said first transistor.

4. A bias network, comprising:
a first transistor having a first drain and configured such that a drain-source saturation voltage is the least voltage that insures said first transistor is biased in its saturation region;
a second transistor having a source coupled to said first drain;
a third transistor having a gate coupled to the gate of said second transistor;
a first generator configured to provide said drain-source saturation voltage;
and
a second generator coupled between said first generator and the source of said third transistor and configured to provide an over-drive voltage;
and further including:
a current source that provides a current to said second transistor; and
a conducting path that couples the gate of said first transistor to the drain of said second transistor;
the sum of said drain-source saturation voltage and said overdrive voltage thereby biasing said first transistor.

5. A bias network, comprising:
a first transistor having a first drain and configured such that a drain-source saturation voltage is the least voltage that insures said first transistor is biased in its saturation region;
a second transistor having a source coupled to said first drain;
a third transistor having a gate coupled to the gate of said second transistor;
a first generator configured to provide said drain-source saturation voltage in response to a first current wherein said first generator includes:
a fourth transistor; and
a fifth transistor having a gate coupled to its drain and to the gate of said fourth transistor and having a source coupled to the drain of said fourth transistor whereby the drain of said fourth transistor provides said drain-source saturation voltage; and
a second generator that includes a resistor coupled between said first generator and the source of said third transistor to thereby provide an over-drive voltage in response to a second current;
further including first and second current sources that provide said second current wherein said resistor has a first end coupled to said first current source and said first generator and has a second end coupled to said second current source and the source of said third transistor;

and further including a sixth transistor having a gate coupled to the gate of said first transistor and having a drain coupled to said first end;

the sum of said drain-source saturation voltage and said overdrive voltage thereby biasing said first transistor.

6. A bias network, comprising:
a first transistor having a first drain and configured such that a drain-source saturation voltage is the least voltage that insures said first transistor is biased in its saturation region;
a second transistor having a source coupled to said first drain;
a third transistor having a gate coupled to the gate of said second transistor;
a first generator configured to provide said drain-source saturation voltage in response to a first current wherein said first generator includes:
 a fourth transistor; and
 a fifth transistor having a gate coupled to its drain and to the gate of said fourth transistor and having a source coupled to the drain of said fourth transistor whereby the drain of said fourth transistor provides said drain-source saturation voltage; and
a second generator that includes a resistor coupled between said first generator and the source of said third transistor to thereby provide an over-drive voltage in response to a second current;
further including first and second current sources that provide said second current wherein said resistor has a first end coupled to said first current source and said first generator and has a second end coupled to said second current source and the source of said third transistor;
and further including a sixth transistor having a gate coupled to the gate of said first transistor and having a drain coupled to said second end;
the sum of said drain-source saturation voltage and said overdrive voltage thereby biasing said first transistor.

7. A bias network, comprising:
a first transistor having a first drain and configured such that a drain-source saturation voltage is the least voltage that insures said first transistor is biased in its saturation region;
a second transistor having a source coupled to said first drain;
a third transistor having a gate coupled to the gate of said second transistor;
a first generator configured to provide said drain-source saturation voltage in response to a first current wherein said first generator includes:
 a fourth transistor; and
 a fifth transistor having a gate coupled to its drain and to the gate of said fourth transistor and having a source coupled to the drain of said fourth transistor whereby the drain of said fourth transistor provides said drain-source saturation voltage; and
a second generator that includes a resistor coupled between said first generator and the source of said third transistor to thereby provide an over-drive voltage in response to a second current;
and further including:
a current source that provides a current to said second transistor; and
a conducting path that couples the gate of said first transistor to the drain of said second transistor;
the sum of said drain-source saturation voltage and said overdrive voltage thereby biasing said first transistor.

8. A bias network, comprising:
a first transistor;
a second transistor with its gate coupled to its drain and the gate of said first transistor, and its source coupled to the drain of said first transistor;
a first voltage-drop generator with first and second ports, with its first port coupled to the drain of said first transistor;
a third transistor with its source coupled to the second port of said first voltage-drop generator; and
a fourth transistor having a common gate connection with said third transistor, said common gate connection providing a first bias signal; and
circuitry establishing substantially equal current densities in said third and fourth transistors.

9. The network of claim 8, wherein the gate of said third transistor provides a bias signal.

10. The network of claim 8, further comprising circuitry which causes said first transistor to carry a first current density and said second transistor to carry a second current density that is less than said first current density.

11. The network of claim 10, wherein said first current density is substantially three times said second current density.

12. The network of claim 8, further comprising a current source with a current coupled to the drain of said first transistor.

13. The network of claim 8, further comprising a current source with a current coupled to the course of said third transistor.

14. The network of claim 8, further comprising a current source arranged to pass a current through said first transistor.

15. The network of claim 8, further comprising a current source arranged to pass a current through said third transistor.

16. The network of claim 8, further comprising a fifth transistor with a drain coupled to the source of said third transistor and arranged to carry a current.

17. The network of claim 8, wherein said voltage-drop generator comprises a resistor.

18. The network of claim 8, further comprising:
a fifth transistor whose source is coupled to the source of the said first transistor.

19. The network of claim 18, wherein the gate of said fifth transistor provides a second bias signal.

20. The network of claim 18, wherein said second voltage-drop generator generates a voltage substantially equal to the drain-source saturation voltage of said fourth transistor.

21. The network of claim 8, wherein the source of said second transistor is directly connected to the drain of said first transistor, and said first port of said first voltage-drop generator is directly connected to the drain of said first transistor.

22. The network of claim 8, wherein said first, second, third and fourth transistors operate with substantially constant currents at a constant temperature.

23. A bias network, comprising:
a first voltage-drop generator with first and second ports;
a second voltage-drop generator with third and fourth ports, with said third port coupled to the second port of the first voltage-drop generator;
a first transistor with its source coupled to the fourth port of said second voltage-drop generator;

a second transistor having a common gate connection with said first transistor, said common gate connection providing a first bias signal; and circuitry establishing substantially equal current densities in said first and second transistors;

wherein said first voltage-drop generator comprises:

a third transistor with its source forming said first port and its drain forming said second port of said first voltage-drop generator; and a fourth transistor with its gate coupled to its drain and the gate of said third transistor, and its source coupled to the drain of said third transistor.

24. The network of claim 23, further comprising a current source with a current coupled to the second port of said first voltage-drop generator.

25. The network of claim 23, further comprising a current source with a current coupled to the source of said first transistor.

26. The network of claim 23, further comprising a third transistor with a drain coupled to the second port of said first voltage-drop generator and arranged to carry a current.

27. The network of claim 23, further comprising:

a third transistor whose source is coupled to said first voltage-drop generator; and said second transistor having its source coupled to the drain of said third transistor.

28. The network of claim 27, wherein the gate of said third transistor provides a second bias signal.

29. The network of claim 23, further comprising circuitry establishing a lower current density through said fourth transistor than through said third transistor.

30. The network of claim 29, wherein the current density through said third transistor is substantially three times the current density through said fourth transistor.

31. The network of claim 23, further comprising:

a current source arranged to pass a current through said fourth transistor.

* * * * *